(12) United States Patent
Chiu

(10) Patent No.: US 7,791,401 B1
(45) Date of Patent: Sep. 7, 2010

(54) ADJUSTMENT OF OP AMP OFFSET VOLTAGE TEMPERATURE COEFFICIENT

(75) Inventor: Kwok-Fu Chiu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 49 days.

(21) Appl. No.: 12/028,670

(22) Filed: Feb. 8, 2008

(51) Int. Cl.
*H01L 35/00* (2006.01)

(52) U.S. Cl. .................. 327/513; 330/256; 330/261

(58) Field of Classification Search .............. 327/513; 330/256, 261
See application file for complete search history.

(56) References Cited

U.S. PATENT DOCUMENTS 4,868,485 A * 9/1989 Ashizaki .................... 323/316
6,181,191 B1 * 1/2001 Paschal ...................... 327/513
6,265,857 B1 * 7/2001 Demsky et al. ............. 323/312
6,614,305 B1 * 9/2003 Ivanov et al. ............... 330/256

* cited by examiner

*Primary Examiner*—Kenneth B. Wells

(57) ABSTRACT

An offset voltage temperature coefficient reduction system for a differential operational amplifier is disclosed. In one embodiment, the offset voltage temperature coefficient reduction system comprises a first current source generating a first current with a positive temperature coefficient and a second current source generating a second current with a negative temperature coefficient, where the first current source and the second current source are coupled to their respective output nodes of the differential op amp such that an error due to an input offset voltage of the differential operational amplifier is approximately constant over a range of temperature, and where a difference between the first current and the second current is approximately zero at a reference temperature. In similar manner, the offset voltage temperature coefficient can be also adjusted to desired value other than zero.

19 Claims, 6 Drawing Sheets

100

400

ADJUSTMENT OF OP AMP OFFSET VOLTAGE TEMPERATURE COEFFICIENT

FIELD OF TECHNOLOGY

This disclosure relates generally to the field of error correction for a differential operational amplifier.

BACKGROUND

Two inputs to a differential operational amplifier (op amp) generally cannot have exact matching characteristics. There is a slight difference between the two inputs known as input offset voltage (Vos). These offsets are amplified like any other input signal and introduce an error. The offset voltage is caused by the mismatch of transistors in the differential operational amplifier and/or other components such as resistors, and such errors may be introduced during fabrication of the device.

FIG. 1 illustrates a conventional differential op amp 100 with an input 102 and an input 104 as the two inputs. In FIG. 1, a transistor T1 is coupled to the input 102, and a transistor T2 is coupled to the input 104. The transistor T1 is also coupled to a resistor $R_a$, and the transistor T2 is coupled to a resistor $R_b$, where the resistor $R_a$ and the resistor $R_b$ are typically matched, and both the resistors $R_a$ and $R_b$ are equal to each other. The input offset voltage is a measure from the two inputs to reflect the magnitude of mismatch of all the component pairs (e.g., T1 and T2 pair, R1 and R2 pair and other component pairs not shown in FIG. 1). The input offset voltage may also change over temperature since the input offset voltage generally depends on temperature, where the measure of temperature dependence is represented as offset voltage temperature coefficient (TC Vos).

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to an offset voltage temperature coefficient reduction system for a differential operational amplifier (op amp) comprising a first current source generating a first current with a positive temperature and a second current source generating a second current with a negative temperature coefficient, where the first current source and the second current source are coupled to respective output nodes of the differential op amp such that an error due to an input offset voltage of the differential amplifier is approximately constant over a range of temperature, and where a difference between the first current and the second current is approximately zero at a reference temperature.

Another embodiment is directed to an offset voltage temperature coefficient reduction system in a differential operational amplifier comprising a first current source generating a first current with a positive temperature coefficient and a second current source generating a second current with zero temperature coefficient, where the current first current source and the second current source are coupled to their respective output nodes of the differential operational amplifier and where a difference between the first current and the second current is approximately zero at a reference temperature.

Yet another embodiment is directed to an offset voltage temperature coefficient reduction system in a differential operational amplifier comprising a first current source generating a first current with a negative temperature coefficient and a second current source generating a second current with zero temperature coefficient, where the first current source and the second current source are coupled to their respective output nodes of the differential operational amplifier and where a difference between the first current and the second current is approximately zero at a reference temperature.

As illustrated in the detailed description, other embodiments pertain to electronic circuits that generate a desired offset voltage temperature coefficient. Moreover, by implementing one or more current sources with a positive and/or negative temperature coefficient, the embodiments generate an additional offset voltage temperature coefficient which is used to compensate the initial offset voltage temperature coefficient of the differential operational amplifier, where the initial offset voltage temperature coefficient (TC Vos) comes from the original chip without the current sources.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Briefly stated, embodiments reduce the effect of temperature on the offset voltage of a differential operational amplifier (op amp) using one or more current sources with a large offset voltage temperature coefficient.

Figure 1:
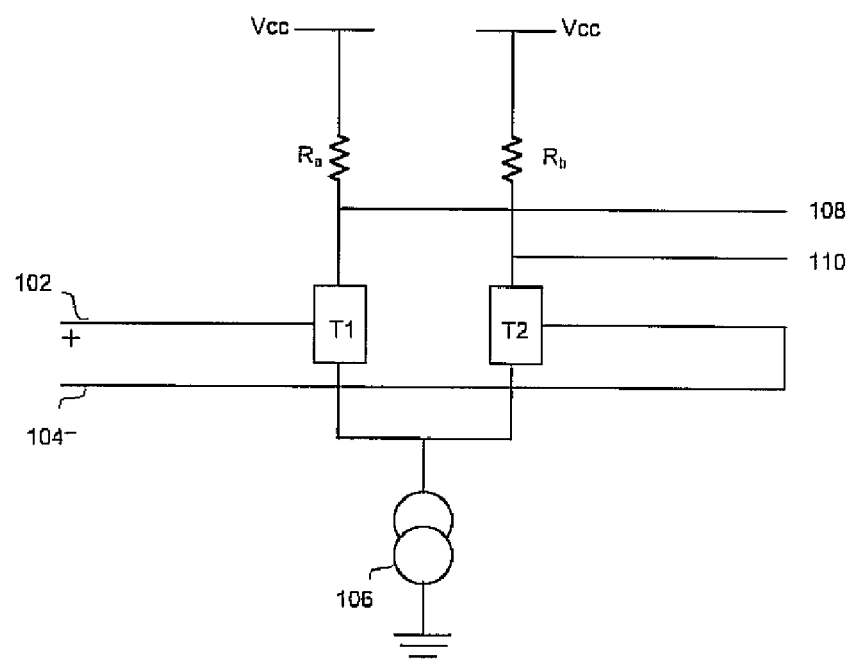
FIG. 1 is a conventional differential op amp with an offset voltage.
Figure 2:
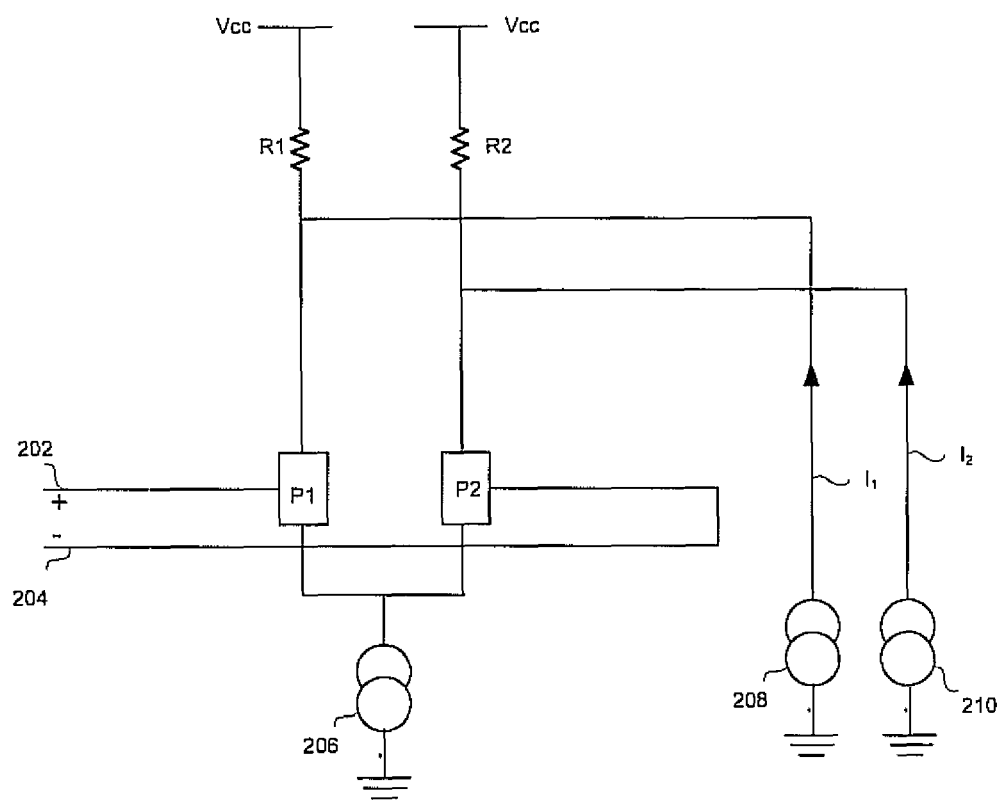
FIG. 2 is an exemplary differential operational amplifier which significantly reduces the effect of temperature on its offset voltage, according to one embodiment.

FIG. 2 is an exemplary differential op amp which significantly reduces the effect of temperature on its offset voltage, according to one embodiment. In FIG. 2, two current sources (e.g., a first current source 208 and a second current source 210) are equal in magnitude at room temperature. The two current sources do not contribute to the offset voltage. At a certain temperature below or above a reference temperature (e.g., room temperature), the two currents are not equal and create additional offset voltage and thus generate a certain offset voltage temperature coefficient. The generated offset voltage temperature coefficient can be designed to cancel or reduce the initial offset voltage temperature coefficient present in the differential op amp.

In FIG. 2, the first current source generating a first current $I_1$ with a positive temperature coefficient and the second current source generating a second current $I_2$ with a negative temperature coefficient are coupled to their respective output nodes of the differential op amp.

Since the first current $I_1$ has a positive temperature coefficient, it increases with the rise of temperature. On the other hand, since the second current $I_2$ has a negative temperature coefficient, it decreases with the rise of temperature. In one exemplary embodiment, the first current $I_1$ is approximately equal to the second current $I_2$ at reference temperature (e.g., room temperature). In one exemplary embodiment, the magnitude of the first current I1 as well as the magnitude of the second current I2 at room temperature is very small compared to the current flowing through the resistor R1 or the resistor R2. This is necessary to prevent the introduction of additional offset voltage.

Figure 3:
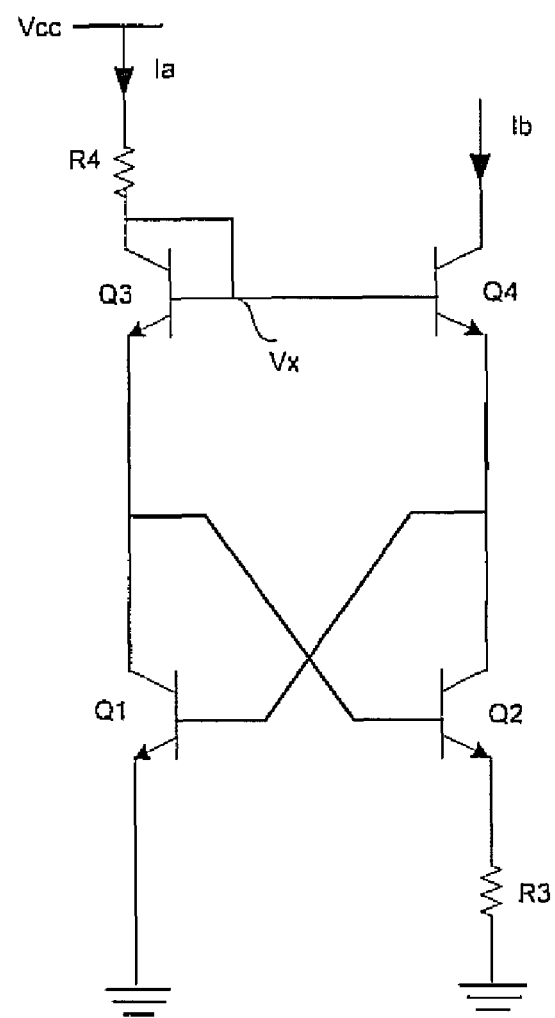
FIG. 3 is an exemplary circuit used to generate a current with a positive temperature coefficient, according to one embodiment.

In one exemplary embodiment, the first current $I_1$ with the positive temperature coefficient is generated using a PTAT current source as will be illustrated in FIG. 3. In one exemplary embodiment, the second current $I_2$ with the negative temperature coefficient is generated using negative characteristics of the base to emitter voltage of a transistor as will be illustrated in FIG. 4.

Thus, $I_1=K_1(\Delta V_{be}/R_{I1})=K_3T/R_{I1}$, where $\Delta V_{be}$ is the difference between the base to emitter voltages of two BJT devices, $R_{I1}$ is a resistor in the first current source 208 through which the first current $I_1$ is flowing, $K_1$ and $K_3$ are constant values, and T is absolute temperature. In one exemplary embodiment, the temperature coefficient is approximately parts per million/° C. On the other hand, $I_2=K_2(V_{be}/R_{I2})=(-K_4T)/R_{I2}$, where $R_{I2}$ is a resistor in the second current source through which the second current $I_2$ is flowing, $V_{be}$ is the base to emitter voltage of a transistor device associated with $R_{I2}$, and $K_2$ and $K_4$ are constant values. In one exemplary embodiment, the temperature coefficient is −parts per million/° C. or −2 mV/° C.

Then, $\Delta I=I_1-I_2=K_1(\Delta V_{be}/R_{I1})-K_2(V_{be}/R_{I2})=K_3T/R_{I1}-(K_8-K_4T)/R_{I2}$, where an approximation is taken as: $Vbe \sim K_8-K_4T$. In one exemplary embodiment, $\Delta I$ is approximately 0 at room temperature. Given that P1 and P2 are equivalent bipolar transistors, an additional offset voltage is generated by this $\Delta I$. Thus, $V_{os'}=\Delta I/gm$, where $V_{os'}$ is the offset voltage introduced by the two current sources and gm is the transconductance of the input stage of the differential op amp.

Moreover, $gm=I_c/V_t$, where $I_c$ is the collector current of the bipolar transistor of the differential pair and $V_t$ is the thermal voltage proportional to temperature. For a high precision amplifier, $I_c$ can be generated by a PTAT current such as the first current 208. Then $gm=(K_5T/R_{gen})/(K_6T)=K_7/R_{gen}$, where $K_5$, $K_6$ and $K_7$ are constant values. Accordingly, $V_{os'}=\Delta I/gm=(K_3T/R_{I1}-(K_8-K_4T)/R_{I2})/K_7/R_{gen}$. Since $R_{I1}$, $R_{I2}$ and $R_{gen}$ are of the same type or can be implemented with the same time, they are proportional to their geometries. Thus the equation can be further simplified as Vos'=Kt where $K=(K_3T/R_{I1}+(K_4T-K_8)/R_{I2})R_{gen}/K_7$.

The equation shows that the offset voltage introduced by the two current sources is temperature dependent. The polarity and/or magnitude of the temperature coefficient of the generated offset voltage can be adjusted based on the resistors (e.g., $R_{I1}$, $R_{I2}$, $R_{gen}$, etc.), the constant values (e.g., $K_3$, $K_4$, $K_7$, $K_8$, etc.) and/or the connection of the two current sources to output nodes of the differential op amp.

In one exemplary embodiment, an offset voltage temperature coefficient reduction system in a differential operational amplifier comprises a first current source generating a first current with a positive temperature coefficient (e.g., which is a PTAT current) and a second current source generating a second current with zero temperature coefficient, where the first current source and the second current source are coupled to respective output nodes of the differential operational amplifier. An additional offset voltage temperature coefficient generated by the first current and the second current cancels or reduces the initial offset voltage temperature coefficient of the differential operational amplifier. The first current and the second current are small in magnitude to minimize the introduction of undesired offset voltage. This small current is ensured by the large positive TC.

In one exemplary embodiment, an offset voltage temperature coefficient reduction system in a differential operational amplifier comprises a first current source generating a first current with a negative temperature coefficient (e.g., which proportional to the base-emitter voltage of a transistor generating the current) and a second current source generating a second current with zero temperature coefficient, where the first current source and the second current source are coupled to respective output nodes of the differential operational amplifier. An additional offset voltage temperature coefficient generated by the first current and the second current cancels or reduces the initial offset voltage temperature coefficient of the differential operational amplifier. The first current and the second current are small in magnitude to minimize the introduction of undesired offset voltage due to the current sources. This small current is ensured by the large negative TC.

The introduction of the large temperature coefficients using two current sources with opposite TC causes the average of the temperature coefficient of the differential op amp to shift toward zero. Accordingly, the offset voltage or the error due to the input offset voltage of the op amp can be maintained over a range of temperature (e.g., hot, cold, etc.). It is appreciated that one current source which generates a current with a positive or negative coefficient with another current source of zero temperature coefficient may be used to bring about a similar result.

FIG. 3 is an exemplary circuit used to generate a current with a positive temperature coefficient, according to one embodiment. In FIG. 3, the circuit comprises a transistor Q1 connected in series with a transistor Q3 and a transistor Q2 connected in series with a transistor Q4. The transistor Q1 is a NPN BJT with its emitter coupled to the ground, its base connected to the collector of the transistor Q2 and the emitter of the transistor Q4 and its collector connected to the emitter of the transistor Q3. The transistor Q2 is a NPN BJT with its emitter connected to a resistor R3, which is connected to the ground, and its collector connected to the emitter of the transistor Q4. In addition, the transistor Q3 is a NPN BJT with its emitter connected to the base of the transistor Q2, with its base connected to both the base of the transistor Q4 and its own collector and with its collector connected to a resistor $R_4$, which is connected to the ground. The transistor Q4 is a NPN BJT which forwards an output current of the circuit 300 from its collector. It is well known in the art that a PTAT circuit such as the circuit 300 generates a current (e.g., $I_b$) proportional to absolute temperature T.

In one example embodiment, the current may be associated with emitter areas of the transistor Q1, the transistor Q2, the transistor Q3 and the transistor Q4. In another example embodiment, the positive temperature coefficient is approximately 3300 parts per million/degree Celsius. It is appreciated that the circuit 300 may be realized with different sizes or types of components.

Figure 4:
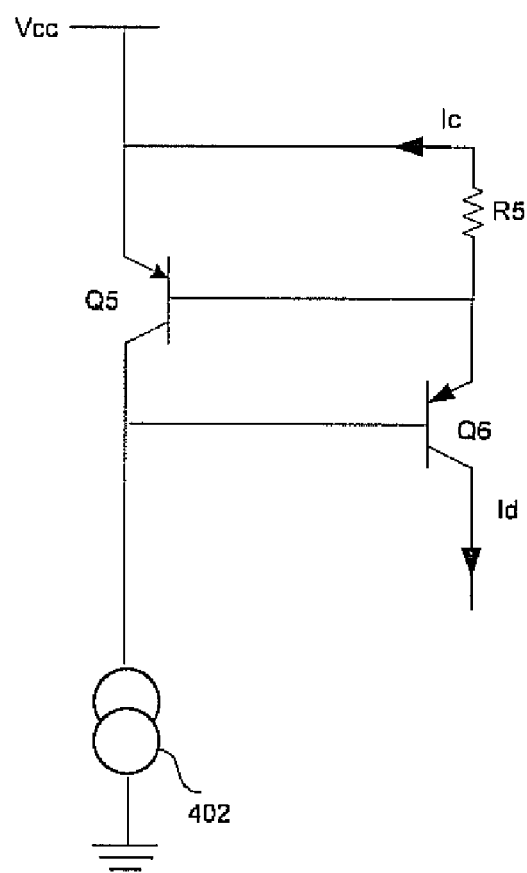
FIG. 4 is an exemplary circuit used to generate a current with a negative temperature coefficient, according to one embodiment.

FIG. 4 is an exemplary circuit used to generate a current with a negative temperature coefficient, according to one embodiment. In FIG. 4, the circuit 400 comprises a transistor Q5 connected in series with a current source 402. The transistor Q5 is a PNP BJT with its emitter connected to both the positive power supply (Vcc) and a resistor R5. The collector of the transistor Q5 is connected to the current source 402 and the base of a transistor Q6. In addition, the transistor Q6 is also a PNP BJT with its emitter connected to the base of the transistor Q5 and the resistor R5 and with its collector generating the output ($I_d$) of the circuit 400.

It is appreciated that the transistor Q6 is equal or similar to the transistor Q5. It is also appreciated that the temperature coefficient of $I_c$ is approximately $-2$ (mv/° C.). Accordingly, since $I_d$ is approximately equal to $I_C$, the output current $I_d$ also has a temperature coefficient of approximately $-2$ (mv/° C.), which is about 3000 ppm/° C. It is also appreciated that the circuit 400 may be realized using different sizes or types of electronic components.

Figure 5:
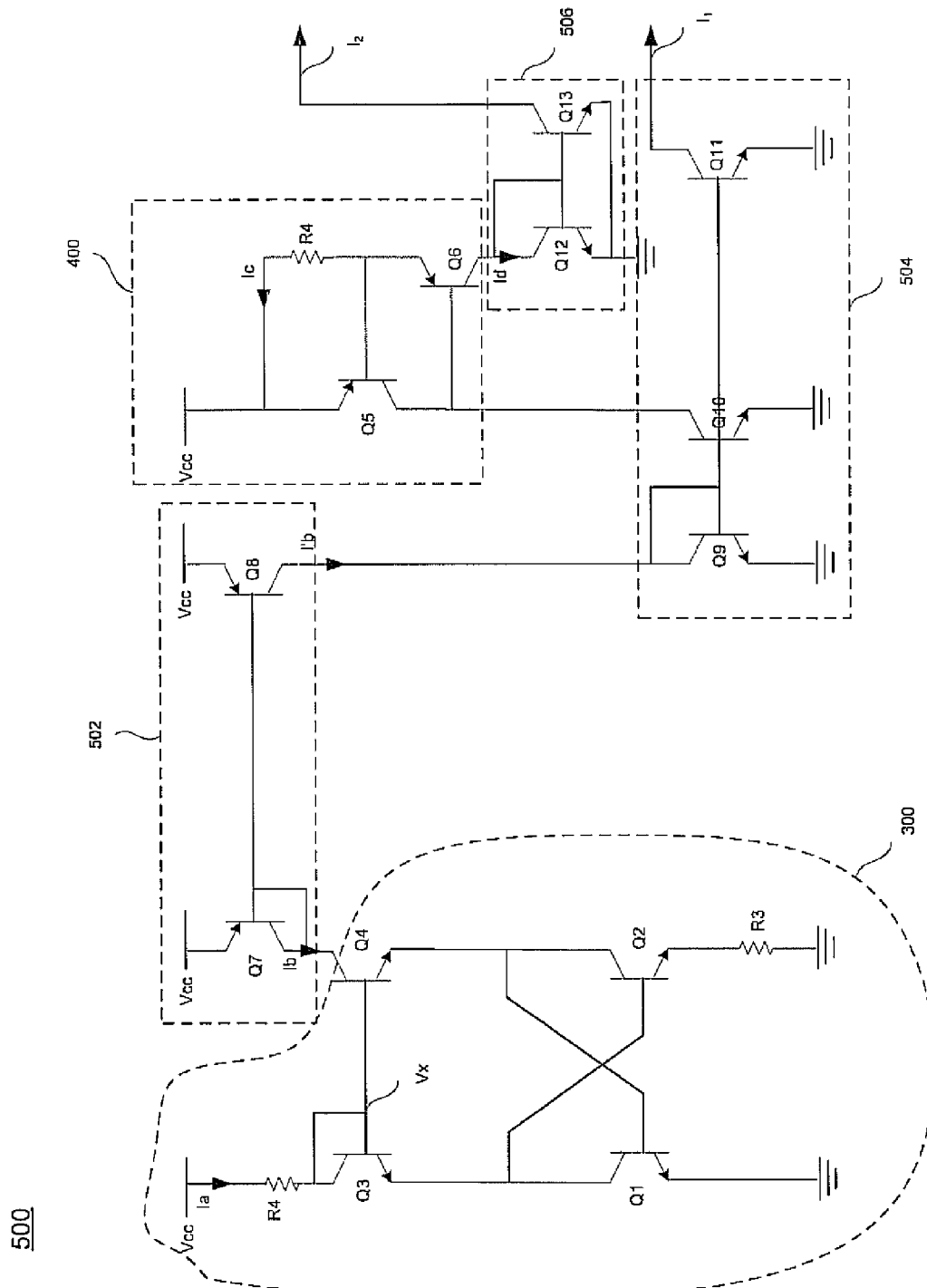
FIG. 5 is an exemplary circuit diagram of a current source circuit generating a current with a positive temperature coefficient and a current with a negative temperature coefficient, according to one embodiment.

FIG. 5 is an exemplary circuit diagram of a current source circuit generating a current with a positive temperature coefficient and a current with a negative temperature coefficient, according to one embodiment. In FIG. 5, the current source circuit 500 comprises the circuit 300 used to generate a current with a positive temperature coefficient and the circuit 400 used to generate a current with a negative temperature coefficient.

The current source circuit 500 also includes one or more current mirror circuits, such as a current mirror circuit 502, a current mirror circuit 504 and a current mirror circuit 506. The current mirror circuit 504 is used to mirror or proportionate the seed current ($I_b$) generated by the circuit 300 to generate the current 208 of FIG. 2. In the similar manner, the current mirror circuit 506 is used mirror or proportionate the seed current ($I_d$) generated by the circuit 400 to generate the current 210. It is appreciated that the current mirrors in the current source circuit can be configured differently using different components to adjust the magnitudes required for the currents 208 and 210.

Figure 6:
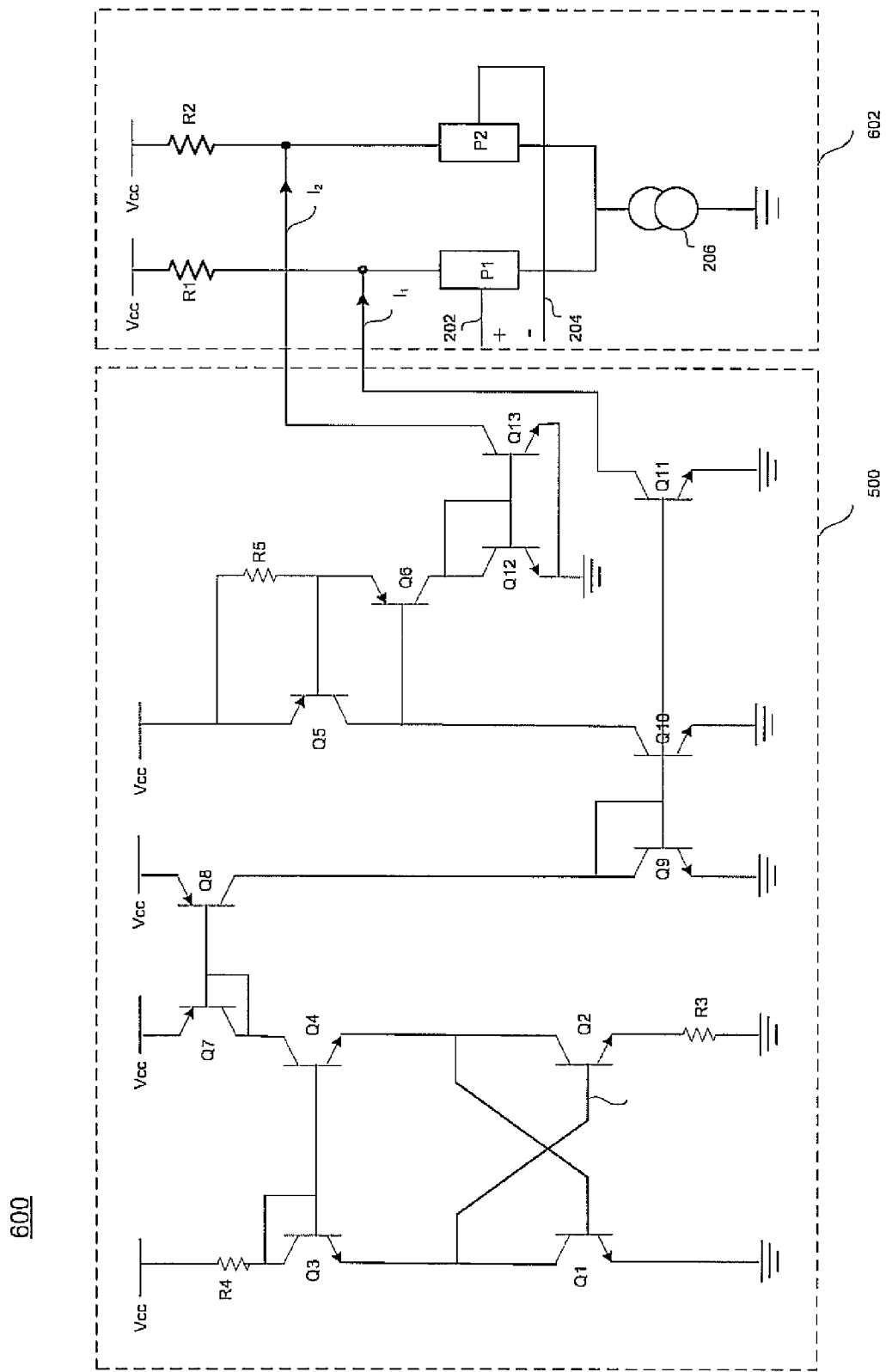
FIG. 6 illustrate a differential operational amplifier with its offset voltage temperature coefficient compensated by a generated offset voltage temperature coefficient, according to one embodiment.

FIG. 6 illustrate a differential operational amplifier with its offset voltage temperature coefficient compensated by a generated offset voltage temperature coefficient, according to one embodiment. In FIG. 6, the current source circuit 500 is used to generate a first current with a positive temperature coefficient and a second current with a negative temperature coefficient.

In one example embodiment, the two current source circuit 500 generating a current with a large positive temperature coefficient and a current with a large negative temperature coefficient is coupled to differential output nodes of a differential operational amplifier 602. With the implementation of the current source circuit 500, $I_1$ equals $I_2$ at room temperature. The large temperature coefficients of $I_1$ and $I_2$ introduce an additional offset voltage at temperatures below or above the room temperature which can be used to compensate the change of offset voltage due to the change of temperature. This would maintain the offset voltage in spite of a rise or fall of temperature. Then, the offset voltage temperature coefficient of the differential op amp 602 is reduced to zero or close to zero. It is appreciated that the current source circuit 500 may be implemented to other electric circuits besides the differential op amp 602 to obtain a desired offset voltage temperature coefficient.

In summary, embodiments described herein pertain to electronic circuits and systems that reduce the effect of temperature on the offset voltage of the differential operational amplifier. By implementing two current sources with large temperature coefficients with opposite polarities, the embodiments nearly eliminate the effect of temperature on the offset voltage.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An offset voltage temperature coefficient reduction system for a differential operational amplifier (op amp), comprising:
    a first current source generating a first current with a positive temperature coefficient; and
    a second current source generating a second current with a negative temperature coefficient, wherein the second current is proportional to an output current generated by the second current source, and wherein the second current source comprises at least one current mirror circuit coupled to the output current to adjust a level of the second current,
    wherein the first current source and the second current source are directly coupled to first and second output nodes, respectively, of the differential op amp; and
    wherein a difference between the first current and the second current is approximately zero at a reference temperature.

2. The system of claim 1, wherein the reference temperature is room temperature.

3. The system of claim 1, wherein a generated offset voltage temperature coefficient due to the first current and the second current reduces an initial offset voltage temperature coefficient of the differential operational amplifier.

4. The system of claim 1, wherein the first current and the second current are less than currents through a first resistor and a second resistor, respectively, of the differential operational amplifier.

5. The system of claim 1, wherein the positive temperature coefficient is approximately 3300 parts per million/degree Celsius and wherein the negative temperature coefficient is approximately −3000 parts per million/degree Celsius.

6. The system of claim 1, wherein the first current is proportional to absolute temperature (PTAT) current.

7. The system of claim 1, wherein the first current source comprises:

a first NPN BJT with an emitter of the first NPN BJT coupled to a ground;

a second NPN BJT with an emitter of the second NPN BJT coupled to the ground via a first resistor and with a base of the second NPN BJT connected to a collector of the first NPN BJT;

a third NPN BJT with an emitter of the third NPN BJT coupled to the collector of the first NPN BJT and to the base of the second NPN BJT and with a base of the third NPN BJT coupled to a collector of the third NPN BJT which is coupled to a positive voltage supply via a second resistor; and a fourth NPN BJT with an emitter of the fourth NPN BJT coupled to a base of the first NPN BJT and to a collector of the second NPN BJT and with a base of the fourth NPN BJT coupled to the base of the third NPN BJT, wherein the first current is proportional to an output current generated by a collector of the fourth NPN BJT.

8. The system of claim 7, further comprising at least one current mirror coupled to the output current to adjust a level of the first current.

9. The system of claim 8, wherein the output current is associated with emitter areas of the first NPN BJT, the second NPN BJT, the third NPN BJT and the fourth NPN BJT.

10. The system of claim 1, wherein the second circuit further comprises:
a first PNP BJT with an emitter of the first PNP BJT coupled to a positive supply voltage, with a collector of the first PNP BJT coupled to a ground and with a base of the first PNP BJT coupled to the emitter of the first PNP BJT via a resistor; and a second PNP BJT with an emitter of the second PNP BJT coupled to the base of the first PNP BJT and with a base of the second PNP BJT coupled to the collector of the first PNP BJT, wherein the output current is generated by a collector of the second PNP BJT.

11. The system of claim 10, wherein the output current is proportional to a base-emitter voltage of the first PNP BJT.

12. An offset voltage temperature coefficient reduction system in a differential operational amplifier, comprising:
a first current source generating a first current with a positive temperature coefficient; and
a second current source generating a second current with a zero temperature coefficient, wherein the first current source and the second current source are directly coupled to first and second output nodes, respectively, of the differential op amp, wherein the second current is proportional to an output current generated by the second current source, and wherein the second current source comprises at least one current mirror circuit coupled to the output current to adjust a level of the second current,
wherein a difference between the first current and the second current is approximately zero at a reference temperature.

13. The system of claim 12, wherein a generated offset voltage temperature coefficient due to the first current and the second current reduces an initial offset voltage temperature coefficient of the differential operational amplifier.

14. The system of claim 12, wherein the first current and the second current are less than currents through a first resistor and a second resistor, respectively, of the differential operational amplifier; and the positive temperature coefficient is approximately 3300 parts per million/degree Celsius.

15. The system of claim 12, wherein the first current is proportional to absolute temperature (PTAT) current.

16. An offset voltage temperature coefficient reduction system in a differential operational amplifier, comprising:
a first current source generating a first current with a negative temperature coefficient; and
a second current source generating a second current with zero temperature coefficient, wherein the first current source and the second current source are directly coupled to first and second output nodes, respectively, of the differential op amp, wherein the second current is proportional to an output current generated by the second current source, and wherein the second current source comprises at least one current mirror circuit coupled to the output current to adjust a level of the second current; and
wherein a difference between the first current and the second current is approximately zero at a reference temperature.

17. The system of claim 16, wherein a generated offset voltage temperature coefficient due to the first current and the second current reduces an initial offset voltage temperature coefficient of the differential operational amplifier.

18. The system of claim 16, wherein the first current and the second current are less than currents through a first resistor and a second resistor, respectively, of the differential operational amplifier; and the negative temperature coefficient is approximately −3000 parts per million/degree Celsius.

19. The system of claim 16, wherein the first current is proportional to a base-emitter voltage of a transistor generating the first current.

* * * * *